United States Patent
Brandl et al.

(10) Patent No.: US 10,937,933 B2
(45) Date of Patent: Mar. 2, 2021

(54) LIGHT-EMITTING COMPONENT AND METHOD OF PRODUCING A LIGHT-EMITTING COMPONENT

(71) Applicant: OSRAM Opto Semiconductors GmbH, Regensburg (DE)

(72) Inventors: Martin Brandl, Kelheim (DE); Markus Pindl, Tegernheim (DE)

(73) Assignee: OSRAM OLED GmbH, Regensburg (DE)

( * ) Notice: Subject to any disclaimer, the term of this patent is extended or adjusted under 35 U.S.C. 154(b) by 0 days.

(21) Appl. No.: 16/490,944

(22) PCT Filed: Mar. 8, 2018

(86) PCT No.: PCT/EP2018/055814
§ 371 (c)(1),
(2) Date: Sep. 4, 2019

(87) PCT Pub. No.: WO2018/162665
PCT Pub. Date: Sep. 13, 2018

(65) Prior Publication Data
US 2020/0028038 A1 Jan. 23, 2020

(30) Foreign Application Priority Data
Mar. 9, 2017 (DE) ..................... 10 2017 105 035.3

(51) Int. Cl.
*H01L 33/54* (2010.01)
*H01L 33/48* (2010.01)
(Continued)

(52) U.S. Cl.
CPC ............ *H01L 33/54* (2013.01); *H01L 33/483* (2013.01); *H01L 33/56* (2013.01); *H01L 33/58* (2013.01);
(Continued)

(58) Field of Classification Search
CPC ........ H01L 33/54; H01L 33/483; H01L 33/56; H01L 33/58; H01L 33/62; H01L 2933/005
(Continued)

(56) References Cited

U.S. PATENT DOCUMENTS

2005/0093005 A1 5/2005 Ruhnau et al.
2011/0140142 A1* 6/2011 Won .................. H01L 33/48
257/98
(Continued)

FOREIGN PATENT DOCUMENTS

DE        102 29 067 B4    8/2007
DE   10 2010 021 791 A1   12/2011
(Continued)

*Primary Examiner* — Tong-Ho Kim
(74) *Attorney, Agent, or Firm* — DLA Piper LLP (US)

(57) ABSTRACT

A light-emitting component includes a light-emitting element and a housing with a cavity. The housing includes a housing material that absorbs at least 80 percent of light in the visible range. The cavity is formed by a limiting wall, formed by a housing surface, and a plane of the element. The light-emitting element arranged within the cavity of the housing and positioned above the element plane includes an emission side located opposite to the element plane. The cavity is at least partially filled with a transparent material composed of a first material and a second material, wherein the first material at least partially covers the limiting wall, and the second material at least partially covers the emission side. A boundary surface is formed between the first material and the second material. A first refractive index of the first material is smaller than a second refractive index of the second material.

16 Claims, 3 Drawing Sheets

(51) Int. Cl.
*H01L 33/58* (2010.01)
*H01L 33/56* (2010.01)
*H01L 33/62* (2010.01)

(52) U.S. Cl.
CPC ........ *H01L 33/62* (2013.01); *H01L 2933/005* (2013.01)

(58) Field of Classification Search
USPC .......................................................... 257/98
See application file for complete search history.

(56) References Cited

U.S. PATENT DOCUMENTS

| | | |
|---|---|---|
| 2012/0319153 A1 | 12/2012 | Matsuda et al. |
| 2013/0092966 A1* | 4/2013 | Jaeger ..................... H01L 33/52 257/98 |
| 2013/0207144 A1 | 8/2013 | Ramchen et al. |
| 2013/0207145 A1* | 8/2013 | Schneider ............... H01L 33/60 257/98 |
| 2014/0285997 A1 | 9/2014 | Nitta et al. |
| 2018/0219125 A1* | 8/2018 | Wicke ..................... H01L 33/56 |

FOREIGN PATENT DOCUMENTS

| | | |
|---|---|---|
| DE | 10 2010 027 253 A1 | 1/2012 |
| DE | 10 2010 026 343 A1 | 3/2012 |
| DE | 11 2013 005 555 T5 | 7/2015 |
| DE | 10 2015 112 042 A1 | 1/2017 |

\* cited by examiner

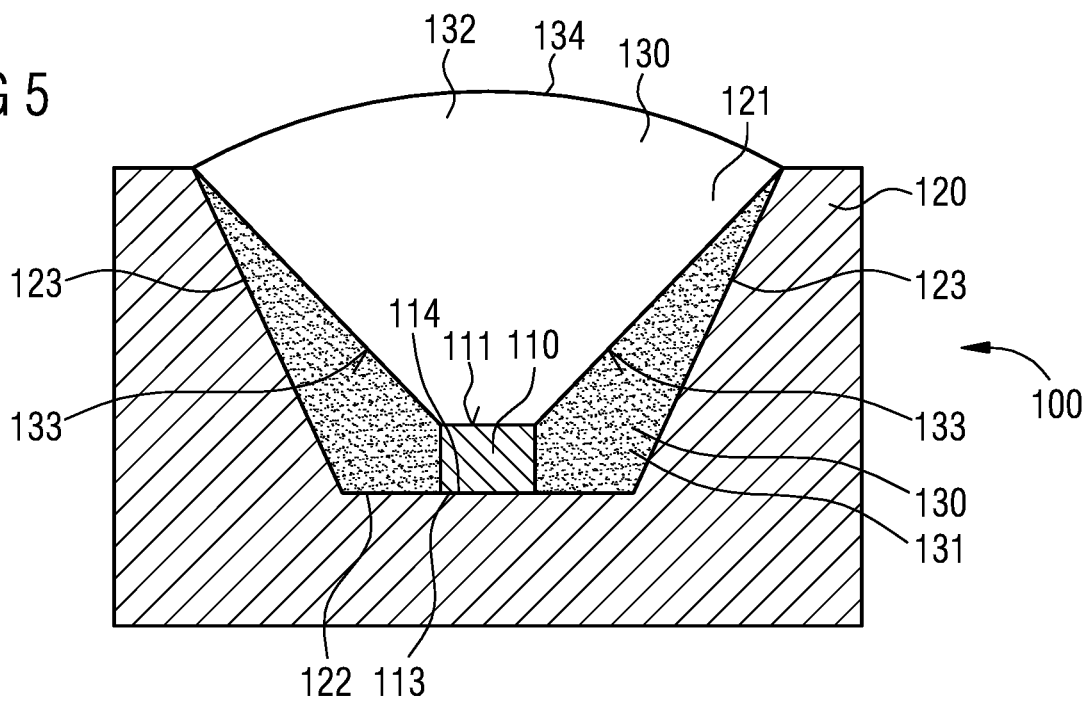

LIGHT-EMITTING COMPONENT AND METHOD OF PRODUCING A LIGHT-EMITTING COMPONENT

TECHNICAL FIELD

This disclosure relates to a light-emitting component and to a method of producing a light-emitting component. The light-emitting component is particularly suitable for use in a display and/or in a video-wall module.

BACKGROUND

Light-emitting components may comprise a white housing, whereby scattered light striking the housing within the light-emitting components is scattered there and may subsequently leave the light-emitting component. For use in displays and video-wall modules, however, such components are unsuitable as the housing for such a component should provide as strong as possible a contrast to the image shown on the display or video-wall module. As a result, components for displays or video-wall modules are manufactured with a black housing. The disadvantage in this context is that light falling out within the housing at an inclined angle is absorbed by the housing. This on the one hand reduces the yield. On the other hand, the housing is heated unnecessarily.

It could therefore be helpful to provide a light-emitting component in which a part of the light emitted laterally within the housing may leave the housing without being absorbed by the housing and a method of manufacturing such a light-emitting component.

SUMMARY

We provide a light-emitting component including a light-emitting element, and a housing having a cavity, wherein the housing includes a housing material, the housing material absorbs at least 80 percent of light in the visible range, the cavity is formed by a limiting wall and an element plane, the limiting wall is formed by a housing surface, the light-emitting element is arranged within the cavity of the housing and positioned above the element plane, the light-emitting element includes an emission side, the emission side is located opposite the element plane, an emission plane extends through the emission side of the light-emitting element, the cavity is at least partially filled with a transparent material, the transparent material is composed of a first material and a second material, the first material at least partially covers the limiting wall, the second material at least partially covers the emission side, a boundary surface is formed between the first material and the second material, and a first refractive index of the first material is smaller than a second refractive index of the second material.

We also provide a method of producing a light-emitting component including providing a housing with a cavity, wherein the housing includes a housing material, the housing material absorbs at least 80 percent of light in the visible range, the cavity is formed by a limiting wall and an element plane, and the limiting wall is formed by a housing surface, positioning a light-emitting element within the cavity of the housing and above the element plane, wherein the light-emitting element includes an emission side, and the emission side is located opposite the element plane, introducing a first transparent material into the cavity by a casting process, wherein the first material at least partially covers the limiting wall, and the first material has a first refractive index, and introducing a second transparent material into the cavity above the first material by a casting process such that the second material at least partially covers the emission side and such that a boundary surface is formed between the first material and the second material, wherein the second material has a second refractive index, the first refractive index being smaller than the second refractive index.

We further provide a light-emitting component including a light-emitting element, and a housing having a cavity, wherein the housing includes a housing material, the housing material absorbs at least 80 percent of light in the visible range, the cavity is formed by a limiting wall and an element plane, the limiting wall is formed by a housing surface, the light-emitting element is arranged within the cavity of the housing and positioned above the element plane, the light-emitting element includes an emission side, the emission side is located opposite the element plane, an emission plane extends through the emission side of the light-emitting element, the cavity is at least partially filled with a transparent material, the transparent material is composed of a first material and a second material, the first material at least partially covers the limiting wall, the second material at least partially covers the emission side, a boundary surface is formed between the first material and the second material, a first refractive index of the first material is smaller than a second refractive index of the second material, the boundary surface has a curve, wherein due to the curve a part of the first material is arranged above the emission plane of the light-emitting element, the curve of the boundary surface is formed such that a beam of light originating from the emission side and transmitted by the light-emitting element strikes the boundary surface at an angle, the angle being larger than a critical angle for a total reflection, and the second refractive index differs by at least 0.05 from the first refractive index.

BRIEF DESCRIPTION OF THE DRAWINGS

FIG. 5 schematically shows a cross section through a further light-emitting component.

Figure 1:
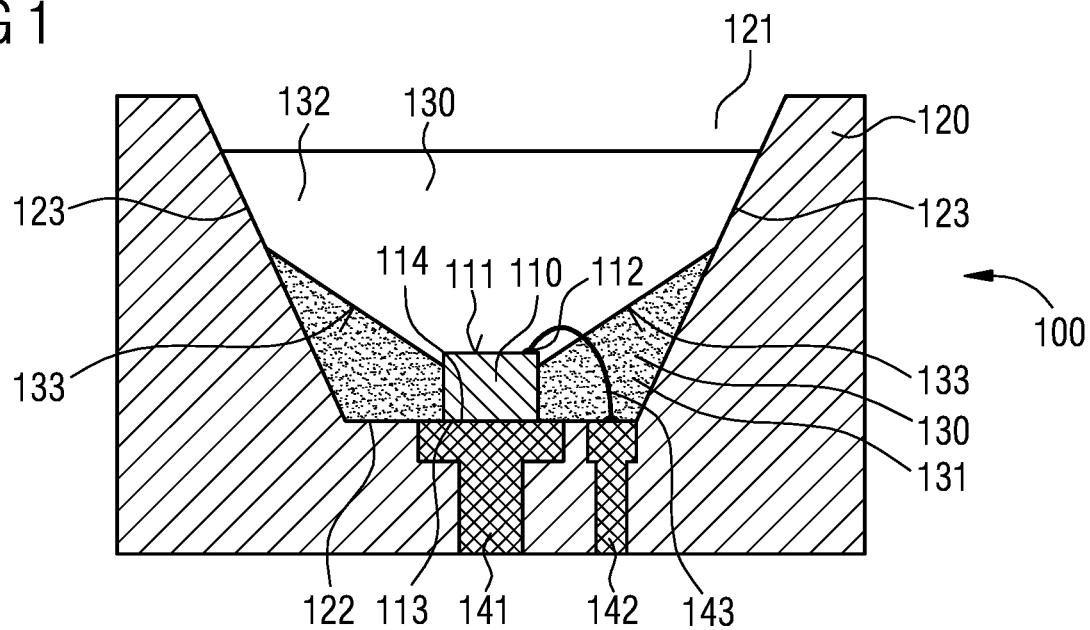
FIG. 1 schematically shows a cross section through a light-emitting component.

REFERENCE LIST 100 light-emitting component
110 light-emitting element
111 emission side
112 upper-side contact
113 bottom-side contact
114 bottom side
120 housing
121 cavity
122 element plane
123 limiting wall
124 further material
130 transparent material
131 first material
132 second material
133 boundary surface
134 optical element 141 first leadframe section
142 second leadframe section
143 bonding wire

DETAILED DESCRIPTION

Our light-emitting component comprises a light-emitting element and a housing having a cavity. The housing comprises a housing material and in particular consists of a housing material. The housing material absorbs at least 80 percent of light in the visible range. The cavity of the housing is formed by a limiting wall and an element plane. Herein, the limiting wall is a surface of the housing. The light-emitting element is arranged within the housing cavity above the element plane. The light-emitting element comprises an emission side located opposite the element plane. An emission plane is defined by the emission side of the light-emitting element. The cavity is at least partially filled by a transparent material. The transparent material is composed of a first material and a second material. The first material at least partially covers the limiting wall. The second material at least partially covers the emission side of the light-emitting element. The first and the second material are adjacent to each other, thus forming a boundary surface between the first and the second material. A first refractive index of the first material is smaller than a second refractive index of the second material.

By choosing the refractive indices of the first material and the second material and the geometric arrangement of the first material such a way that the first material at least partially covers the limiting wall and such a way that the second material at least partially covers the emission side of the light-emitting element, a part of the light emitted laterally by the light-emitting element which, without the transparent material within the cavity, would strike the limiting wall, may be reflected at the boundary surface between the first and second material. Thereby, the light that would, without the transparent material, strike the limiting wall may be emitted by the light-emitting component. This increases the yield of the light-emitting component.

It is particularly advantageous to arrange the first material and the second material within the cavity such that at least a part of the light emitted by the light-emitting component in the direction of the limiting wall strikes the boundary surface at an angle, the angle being larger than a critical angle for a total reflection at the boundary surface.

In this context, the critical angle for total reflection is the arc sine of the ratio between the first refractive index and the second refractive index.

The boundary surface may be curved. Due to the curve of the boundary surface, a part of the first material is arranged above the emission plane of the light-emitting element. This further improves the light-emitting element as the total reflection is easier to reach for a part of the light.

The curve of the boundary surface may be configured such that a beam of light originating from the emission side and transmitted by the light-emitting element strikes the boundary surface at an angle. Herein, the angle is larger than a critical angle for a total reflection.

By arranging the first material and the second material in such a way, light beams emitted laterally by the light-emitting element may strike the boundary surface between the first and second material such that the prerequisites for a total reflection are fulfilled at the spot where the light strikes the boundary surface. As a result, the emitted light is completely reflected at the boundary surface, which allows it to leave the light-emitting component instead of striking the limiting wall and being absorbed there.

The critical angle for total reflection is in this context again the arc sine of the ration between the first and the second refractive index.

The second material may completely cover the emission side of the light-emitting element. Due to the first material, the cavity may be filled adjacent to the light-emitting component up to the emission plane. The emission side and the boundary surface may fuse into each other with a constant tangent. If the second material completely covers the emission side, the light emitted by the light-emitting element may more easily be coupled into the second material. This is particularly true if the light-emitting element is a light-emitting semiconductor chip with a refractive index, wherein the refractive index corresponds or almost corresponds to the second refractive index. Due to the fact that the emission side and the boundary surface fuse into each other with a constant tangent, light that would laterally leave the light-emitting element below the emission side may strike the limiting wall within the first material in a rectilinear manner and is not reflected at the boundary surface. This is particularly advantageous if the light-emitting element comprises a conversion element adjacent to the emission side and light from a semiconductor chip located below the conversion element laterally leaves the light-emitting element. The scattered light is then not coupled out of the light-emitting component, but is absorbed by the housing.

"With a constant tangent" means that the emission side fuses into the boundary surface without buckling, i.e. the second material does not show any buckling in the transition area between the light-emitting element and the first material.

The boundary surface may be rotationally symmetric round an axis through the element. Thereby, a uniform boundary surface may be provided for total reflection.

The second refractive index may differ from the first refractive index by at least 0.05. The first refractive index may be smaller than or corresponds to 1.42 and the second refractive index is larger or corresponds to 1.48. With the refractive indices or, respectively, the differences in the refractive indices, a good total reflection may be achieved at the boundary surface between the first material and the second material.

The first material may comprise an epoxy resin or a silicon or an acrylate. The second material may comprise an epoxy resin or a silicon or an acrylate. The materials may be transparent for visible light and due to their refractive indices suitable for use as a first or, respectively, second material.

The first material may be a polymethylsiloxane and the second material is a polymethylphenlysiloxane. Polymethylsiloxanes have a refractive index of about 1.41 while polymethylphenlysiloxanes have a refractive index of about 1.48 and more, with the refractive index increasing with the ratio of phenyl groups relative to methyl groups. As a result, the materials are suitable for a light-emitting component having a totally reflecting boundary layer between the materials. Moreover, polymethlsiloxanes and polymethylphenylsiloxanes are materials that may be processed in a simple manner.

The first material may at least partially cover the element plane. This allows for a geometrically advantageous arrangement of the first and second material.

A further material may be arranged between the element plane and the first material. The further material may absorb at least 80 percent of light in the visible range. In general, at least one leadframe section or another conductive element is arranged within the housing and within the cavity, whereby an electrical contacting of the light-emitting element is allowed for. If the cavity is filled or partly filled with a transparent material, the leadframe section or the other conductive element is visible from above. By arranging a further material between the element plane and the first material, the material absorbing the visible light, the leadframe section or the other conductive element may correspondingly be covered by the further material and is thus no longer directly visible. This is particularly advantageous if the further material is not arranged within the cavity until the electrical contacting of the light-emitting element has been finalized.

The light-emitting element may comprise a semiconductor chip and in particular three semiconductor chips. The light-emitting component may thus comprise a light-emitting semiconductor chip within the light-emitting element and may as a result emit one of the three colors required for a display, either red, green or blue. For each pixel of the display, three such light-emitting components are hence required, wherein one of the three components respectively emits red light, green light and blue light. As an alternative, a light-emitting element may be provided that comprises three semiconductor chips. As a result, one single light-emitting element is able to emit red light, green light and blue light. As a result, only one light-emitting component is required for a pixel of the display.

The second material may be formed as an optical element above the cavity. This may e.g. be carried out by a convex or concave surface of the second material.

In a method of producing a light-emitting element, a housing with a cavity is at first provided. Thereby, the housing comprises a housing material that absorbs at least 80 percent of light in the visible range. The cavity is formed by a limiting wall and an element plane. In this context, the limiting wall is a housing surface. A light-emitting element is subsequently positioned within the cavity of the housing and above the element plane. The light-emitting element has an emission side opposite the element plane. A first transparent material is subsequently introduced into the cavity by a casting process. Thereby, the first material is introduced such that the first material at least partially covers the limiting wall. The first material has a first refractive index. A second transparent material is subsequently introduced into the cavity above the first material by a casting process. The second material at least partially covers the emission side. A boundary surface is thereby formed between the first material and the second material. The second material comprises a second refractive index larger than the first refractive index of the first material. In this manner, a totally reflecting boundary surface may be generated between the first and second material.

Between positioning the light-emitting element within the cavity and introducing the first transparent material into the cavity, an electrical contacting of the light-emitting element may be carried out. This may e.g. be done by a soldering process or bonding bond pads.

The shape of the material deposited in the casting process may depend on the geometry of the cavity and on a surface tension of the first material during the casting process. Due to the amount of first material deposited in the cavity and the shape of the cavity and surface tension, an individual surface of first material is generated. Subsequently, curing of the material may be carried out so that the first material is no longer liquid, but solid. Then, the second material may be introduced into the cavity, wherein the second material is introduced such that it abuts on the boundary surface.

A further material may be arranged between the element plane and the first material by a casting process. The further material may absorb at least 80 percent of light in the visible range.

The above-described properties, features and advantages as well as the manner in which they are achieved will become clearer in context with the following description of examples explained in more detail in conjunction with the drawings.

FIG. 1 shows a cross section through a light-emitting component 100. The light-emitting component 100 comprises a light-emitting element 110 and a housing 120 with a cavity 121. The housing 120 comprises a housing material that absorbs at least 80 percent of light in the visible range. The cavity 121 is formed by a component plane 122 and a limiting wall 123. The limiting wall 123 is in this context a surface of the housing 120. The light-emitting element 110 is arranged within the cavity of the housing 120 above the element plane 122. The housing 120 comprises a first leadframe section 141 below the light-emitting element 110 and a second leadframe section 142 beside the first leadframe section 141. The light-emitting element 110 abuts on the first leadframe section 141 with a bottom side 114. The bottom side 114 of the light-emitting element 110 thereby abuts on the element plane 122. An emission side 111 opposite the element plane 122 comprises an upper-side contact 112 connected to the second leadframe section 142 via a bond wire 143. Instead of the electrical contacting by the first leadframe section 114, second leadframe section 142 and bond wire 143 shown in FIG. 1, other contacting means are possible.

The cavity 121 is partially filled with a transparent material 130. The transparent material 130 is in this context composed of a first material 131 and a second material 132. The first material 131 laterally abuts on the light-emitting element 110 as well as partially on the limiting wall 123. In this way, the first material 131 partly covers the limiting wall 123. The second material 132 covers the emission side 111. Between the first material 131 and the second material 132, a boundary surface 133 is formed. A first refractive index of the first material 131 is smaller than a second refractive index of the second material 132. The boundary surface 133 is thereby arranged linearly in cross section and at an inclined angle with regard to the element plane 122. Light leaving the light-emitting element 110 laterally at a relatively flat angle may be totally reflected at the boundary surface 133, thus being emitted out of the light-emitting component 100. A part of the light emitted by the light-emitting element 110 thus strikes the boundary surface 133 at an angle, wherein the angle is larger than the arc sine of the ratio between first and second refractive index.

Figure 2:
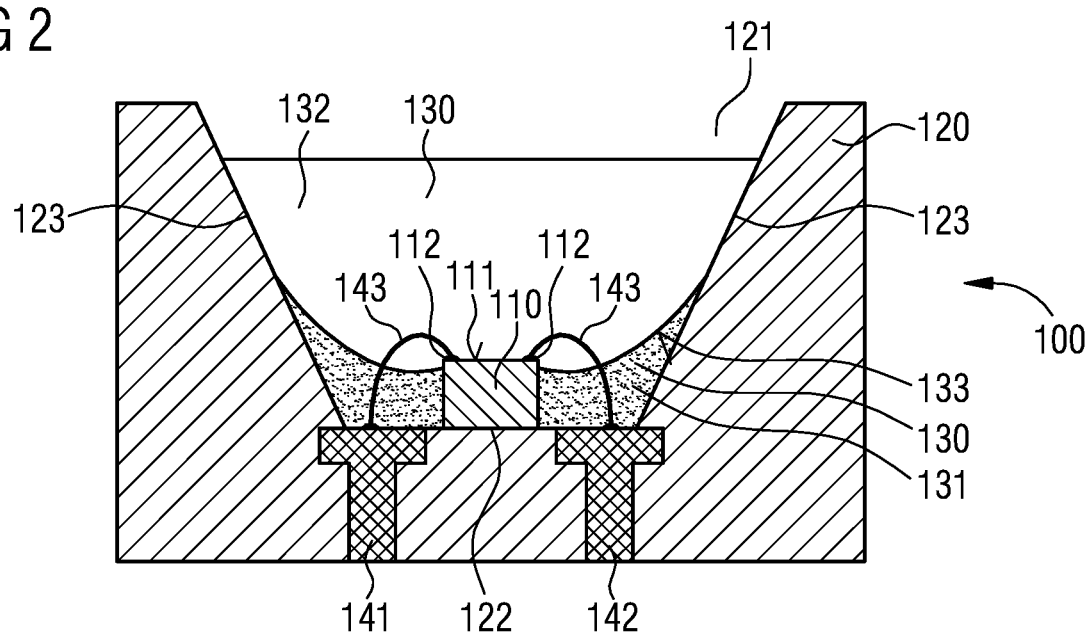
FIG. 2 schematically shows a cross section through a further light-emitting component.

FIG. 2 depicts a cross-sectional view through a further light-emitting component 100 that in its essential design corresponds to the light-emitting component 100 of FIG. 1. The light-emitting element 110 comprises two upper-side contacts 112, wherein the upper-side contacts 112 each connect to the leadframe sections 141, 142 in an electrically conductive manner by a bond wire 143. The boundary surface 133 between the first material 131 and the second material 132 is curved in the light-emitting component 100 of FIG. 2. Due to the curve, a part of the first material 131 is arranged above the emission plane defined by the emission side 111.

In an example, a beam of light originating from the emission side 111 and transmitted by the light-emitting element 110 strikes the boundary surface at an angle such that the angle is larger than a critical angle for a total reflection. Thereby, the light emitted from the light-emitting element 110 is reflected totally at the boundary surface 133 and may thus leave the housing 120 without striking the limiting wall 123.

The light emitted from the light-emitting element 110 thus strikes the boundary surface 133 at an angle larger than the arc sine of the ratio between first and second refractive index.

Figure 3:
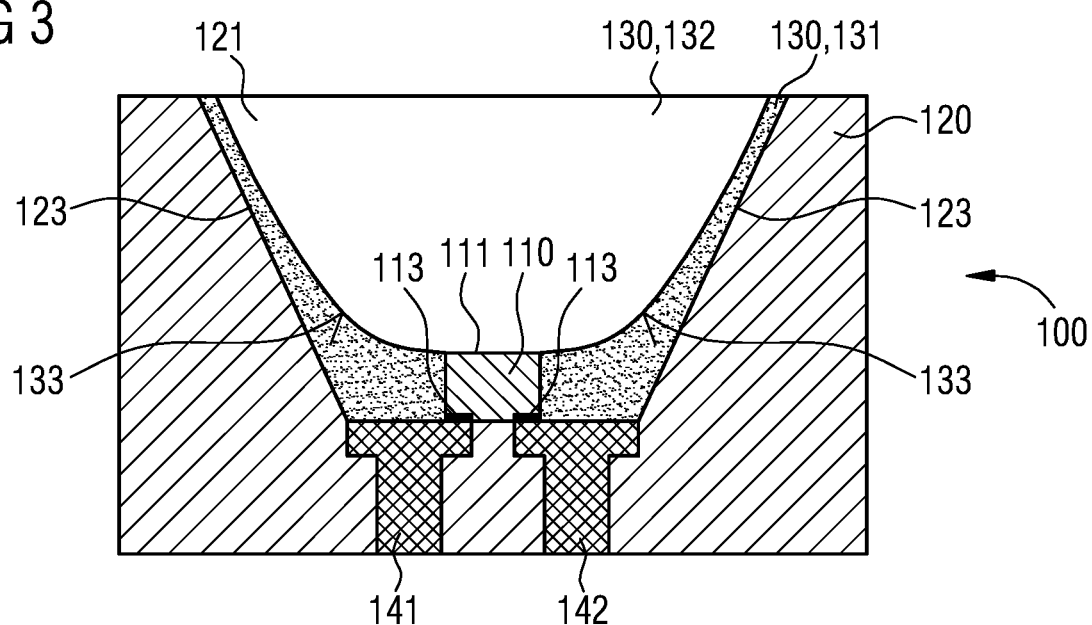
FIG. 3 schematically shows a cross section through a further light-emitting component.

FIG. 3 shows a cross section through a further light-emitting component 100 that in its essential design corresponds to the light-emitting component 100 of FIG. 1. The transparent material 130 is arranged such that the cavity 121 is completely filled up by the transparent material 130. The first material 131 is arranged in the cavity 121 such that the first material 131 completely covers the limiting wall 123. The first material 131 is hence laterally arranged at the limiting wall 123 up to the upper end of the cavity 121. The second material 132, in turn, forms a boundary surface 133 with the first material 131. In the area of the light-emitting element 110, the first material is arranged such that the cavity 121 is filled up adjacent to the light-emitting element 110 up to the emission plane that is defined by the emission side 111. The emission side 111 and the boundary surface 133 fuse into each other at a constant tangent. This means that the emission side 111 and the boundary surface 133 fuse into each other at the light-emitting element 110 without buckling.

The light-emitting element 110 of FIG. 3 comprises two bottom-side contacts 113, wherein the bottom-side contacts 113 are each arranged on a leadframe section 141, 142. The electrical contactings of the examples of the light-emitting component of FIGS. 1 to 3 may be exchanged among one another. In the examples in which a bond wire 143 is used, it may be provided that the bond wire 143 runs within the first material 131 and within the second material 132. This means that the bond wire 143 is at a certain spot guided through the boundary surface 133.

In an example, the boundary surface 133 is rotationally symmetric around an axis through the light-emitting element 110. This may in particular be generated by the fact that the cavity 121 is already rotationally symmetric around the axis.

In another example, the second refractive index of the second material 132 and the first refractive index of the first material 131 differ by more than 0.05. In an example, the first refractive index of the first material is smaller or corresponds to 1.42 and the second refractive index of the second material is higher or corresponds to 1.48.

In an example, the first material 131 is an epoxy resin or a silicon or an acrylate. Moreover, it may be provided that the first material 131 comprises one of the mentioned or a plurality of the materials. In an example, the second material 132 is a silicon, an epoxy resin or an acrylate. It may also be provided that the second material 132 comprises one of the materials or a combination of the materials.

In another example, the first material 131 is a polymethylsiloxane. The second material 132 is a polymethylphenylsiloxane. Polymethylsiloxanes have a refractive index of about 1.41. Polymethylphenylsiloxanes have a refractive index of about 1.48. Polymethylsiloxanes as well as polymethylphenylsiloxanes may be transparent to visible light. This makes these materials suitable for use as first material 131 and second material 132 for a light-emitting component 100 with a housing 120 absorbing light in the visible range.

In the examples of FIGS. 1 to 3, the first material 131 at least partially covers the element plane 122.

Figure 4:
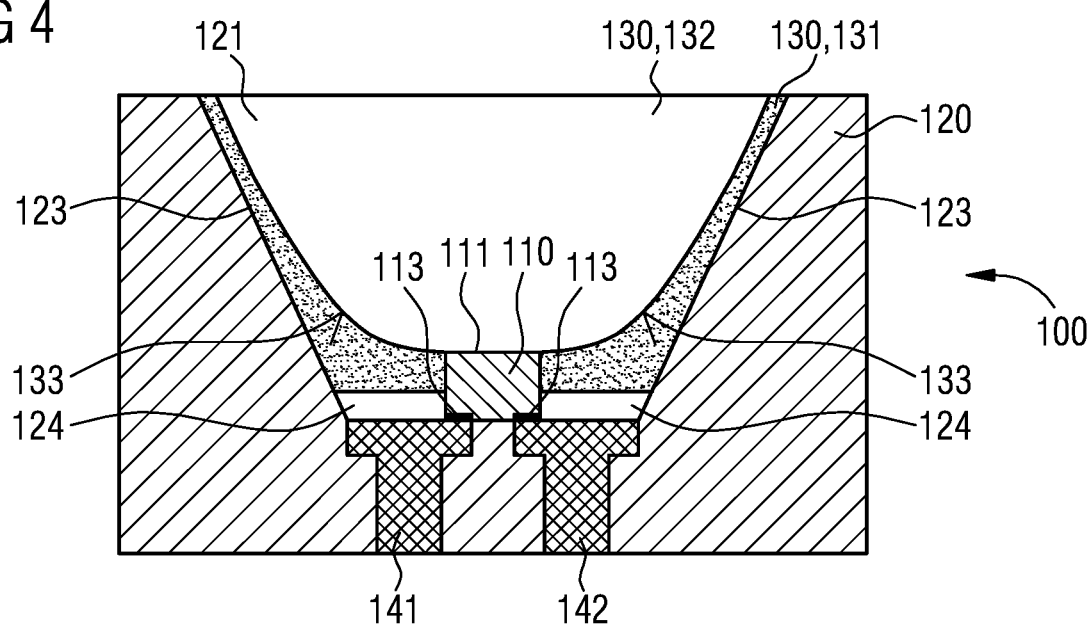
FIG. 4 schematically shows a cross section through a further light-emitting component.

FIG. 4 shows a cross section through a further example of a light-emitting component 100 designed in analogy to the light-emitting component 100 of FIG. 3. A further material 124 is arranged between the element plane 122 and the first material 131. The further material 124 absorbs at least 80 percent of light in the visible range. The further material 124 is in particular arranged such that it covers the leadframe sections 141, 142. In this way, an observer looking down on the light-emitting component 100 cannot see the leadframe sections 141, 142 as they are covered by the further material 124.

FIG. 5 shows a further example of a light-emitting component 100 in which the second material 132 is partially arranged outside of the cavity 121. Above the cavity 121, the second material 132 forms an optical element 134 formed as a convex lens. The second material 132, however, may have a different shape, e.g. of a concave lens or Fresnell lens.

In an example, the light-emitting element 110 comprises a semiconductor chip. Thus, the light-emitting element 110 may consist of a semiconductor chip contacted as shown in FIGS. 1 to 3. Alternatively, the light-emitting element 110 may comprise further components, e.g. an associated housing or a conversion element. Regardless of this, the light-emitting element 110 emits to the second material 132 via the emission side 111, wherein a part of the light that would directly reach the limiting wall 123 is totally reflected at the boundary surface 133. In this context, it may be provided for a display or for a video-wall module that light-emitting components 100 with red emission, green emission as well as with blue emission are used.

In another example, the light-emitting element 110 comprises three semiconductor chips wherein each semiconductor chip may be addressed individually and by one semiconductor chip red light is emitted, by another semiconductor chip green light and by another semiconductor chip blue light is emitted. In this example, the light-emitting component 100 serves as an a pixel of the video-wall module or display while when the light-emitting element 110 only comprises one light-emitting semiconductor chip, at least three light-emitting components 100 have to be combined to result in an a pixel.

In a method of producing a light-emitting component 100, a housing 120 with a cavity 121 is at first provided. The housing 120 comprises a housing material absorbing at least 80 percent of light in the visible range. The cavity 121 is formed by a limiting wall 123 and an element plane 122. Thereby, the limiting wall 123 is formed by a surface of the housing 120. In a subsequent step, a light-emitting element 110 is positioned within the cavity 121 of the housing 120 above the element plane 122. The light-emitting element 110 comprises an emission side 111 to which the element plane 122 is located opposite. Subsequently, an electrical contacting of the light-emitting element 110 may be provided. Then, a first transparent material 131 is deposited in the cavity 121 by a casting process. The first material 131 at least partially covers the limiting wall 123 and has a first refractive index. The shape of the first material 131 is determined by the shape of the cavity 121, the first material 131 and a surface tension of the first material 131. Subsequently, a curing step may be provided to harden the first material 131. In a next step, a second material 132 is deposited in the cavity 121 by a casting process. The second material at least partially covers the emission side 111 of the light-emitting element 110 and forms a boundary surface 133 with the first material 131. A second refractive index of the second material 132 is in this context higher than the first refractive index.

By the method, the light-emitting components 100 of FIGS. 1 to 3 may be produced by introducing and positioning the materials in the described order.

To produce the light-emitting component of FIG. 4, a further material 124 is introduced into the cavity 121 by a casting process after depositing the light-emitting element 110. This is carried out such that the further material 124 at least partially covers the element plane 122. As the housing material of housing 120, the further material 124 absorbs at least 80 percent of light in the visible range.

Instead of a casting process, injection molding may be used to introduce the second material 132 into the cavity 121. This is particularly advantageous for producing the example of FIG. 5 in which the shape of the optical element of the transparent second material 132 may be determined by an injection-molded shape.

Although our components and methods are depicted and described in detail by preferred examples, this disclosure is not limited to the disclosed examples and other variations may be derived by those skilled in the art without exceeding the protective scope of the appended claims.

This application claims priority of DE 10 2017 105 035.3, the subject matter of which is incorporated herein by reference.

The invention claimed is:

1. A light-emitting component, comprising:
a light-emitting element, and
a housing having a cavity,
wherein the housing comprises a housing material,
the housing material absorbs at least 80 percent of light in a visible range,
the cavity is formed by a limiting wall and an element plane,
the limiting wall is formed by a housing surface,
the light-emitting element is arranged within the cavity of the housing and positioned above the element plane,
the light-emitting element comprises an emission side,
the emission side is located opposite the element plane,
an emission plane extends through the emission side of the light-emitting element,
the cavity is at least partially filled with a transparent material,
the transparent material is composed of a first material and a second material,
the first material at least partially covers the limiting wall,
the second material at least partially covers the emission side,
a boundary surface is formed between the first material and the second material,
a first refractive index of the first material is smaller than a second refractive index of the second material, and
the second refractive index differs by at least 0.05 from the first refractive index.

2. The light-emitting component according to claim 1, wherein the boundary surface has a curve, and due to the curve, a part of the first material is arranged above the emission plane of the light-emitting element.

3. The light-emitting component according to claim 2, wherein the curve of the boundary surface is formed such that a beam of light originating from the emission side and transmitted by the light-emitting element strikes the boundary surface at an angle, the angle being larger than a critical angle for a total reflection.

4. The light-emitting component according to claim 1, wherein the second material completely covers the emission side of the light-emitting element, due to the first material, the cavity is filled up to the emission plane adjacent to the light-emitting element, and the emission side and the boundary surface fuse into each other with a constant tangent.

5. The light-emitting component according to claim 1, wherein the boundary surface is rotationally symmetric around an axis running through the light-emitting element.

6. The light-emitting component according to claim 1, wherein the first refractive index is smaller or corresponds to 1.42 and the second refractive index is higher or corresponds to 1.48.

7. The light-emitting component according to claim 1, wherein the first material comprises an epoxy resin or a silicon or an acrylate and/or the second material comprises an epoxy resin or a silicon or an acrylate.

8. The light-emitting component according to claim 7, wherein the first material is a polymethylsiloxane and the second material is a polymethylphenylsil oxane.

9. The light-emitting component according claim 1, wherein the first material at least partially covers the element plane.

10. The light-emitting component according to claim 1, wherein a further material is arranged between the component plane and the first material, and the further material absorbs at least 80 percent of light in the visible range.

11. The light-emitting component according to claim 1, wherein the light-emitting element comprises a semiconductor chip or three semiconductor chips.

12. The light-emitting component according to claim 1, wherein the second material is formed as an optical element above the cavity.

13. A light-emitting component comprising:
a light-emitting element, and
a housing having a cavity,
wherein the housing comprises a housing material,
the housing material absorbs at least 80 percent of light in a visible range,
the cavity is formed by a limiting wall and an element plane,
the limiting wall is formed by a housing surface,
the light-emitting element is arranged within the cavity of the housing and positioned above the element plane,
the light-emitting element comprises an emission side,
the emission side is located opposite the element plane,
an emission plane extends through the emission side of the light-emitting element,
the cavity is at least partially filled with a transparent material,
the transparent material is composed of a first material and a second material,
the first material at least partially covers the limiting wall,
the second material at least partially covers the emission side,
a boundary surface is formed between the first material and the second material,
a first refractive index of the first material is smaller than a second refractive index of the second material,
the boundary surface has a curve, wherein due to the curve a part of the first material is arranged above the emission plane of the light-emitting element, and
the curve of the boundary surface is formed such that a beam of light originating from the emission side and transmitted by the light-emitting element strikes the boundary surface at an angle, the angle being larger than a critical angle for a total reflection.

14. The light-emitting component according to claim 13, wherein the second refractive index differs by at least 0.05 from the first refractive index, the first refractive index is smaller or corresponds to 1.42, and the second refractive index is higher or corresponds to 1.48.

15. A light-emitting component, comprising:
a light-emitting element, and
a housing having a cavity,
wherein the housing comprises a housing material,
the housing material absorbs at least 80 percent of light in a visible range,
the cavity is formed by a limiting wall and an element plane,
the limiting wall is formed by a housing surface,
the light-emitting element is arranged within the cavity of the housing and positioned above the element plane,
the light-emitting element comprises an emission side,
the emission side is located opposite the element plane,
an emission plane extends through the emission side of the light-emitting element,
the cavity is at least partially filled with a transparent material,
the transparent material is composed of a first material and a second material,
the first material at least partially covers the limiting wall,
the second material at least partially covers the emission side,
a boundary surface is formed between the first material and the second material,
a first refractive index of the first material is smaller than a second refractive index of the second material,
the first material comprises an epoxy resin or a silicon or an acrylate and/or the second material comprises an epoxy resin or a silicon or an acrylate, and
the first material is a polymethylsiloxane and the second material is a polymethylphenylsiloxane.

16. A light-emitting component, comprising:
a light-emitting element, and
a housing having a cavity,
wherein the housing comprises a housing material,
the housing material absorbs at least 80 percent of light in a visible range,
the cavity is formed by a limiting wall and an element plane,
the limiting wall is formed by a housing surface,
the light-emitting element is arranged within the cavity of the housing and positioned above the element plane,
the light-emitting element comprises an emission side,
the emission side is located opposite the element plane,
an emission plane extends through the emission side of the light-emitting element,
the cavity is at least partially filled with a transparent material,
the transparent material is composed of a first material and a second material,
the first material at least partially covers the limiting wall,
the second material at least partially covers the emission side,
a boundary surface is formed between the first material and the second material,
a first refractive index of the first material is smaller than a second refractive index of the second material, and
a further material is arranged between the component plane and the first material, and the further material absorbs at least 80 percent of light in the visible range.

\* \* \* \* \*